US009264002B2

(12) United States Patent
Ni et al.

(10) Patent No.: US 9,264,002 B2
(45) Date of Patent: Feb. 16, 2016

(54) APPARATUS AND METHODS FOR IMPROVING COMMON MODE REJECTION RATIO

(71) Applicant: ANALOG DEVICES GLOBAL, Hamilton (BM)

(72) Inventors: Jinhua Ni, Shanghai (CN); Dan Li, Shanghai (CN)

(73) Assignee: ANALOG DEVICES GLOBAL, Hamilton (BM)

( * ) Notice: Subject to any disclaimer, the term of this patent is extended or adjusted under 35 U.S.C. 154(b) by 81 days.

(21) Appl. No.: 14/184,555

(22) Filed: Feb. 19, 2014

(65) Prior Publication Data
US 2015/0236662 A1 Aug. 20, 2015

(51) Int. Cl.
*H03F 3/45* (2006.01)
(52) U.S. Cl.
CPC ...... *H03F 3/45479* (2013.01); *H03F 2200/129* (2013.01); *H03F 2203/45112* (2013.01)
(58) Field of Classification Search
CPC ........................................................ H03F 3/45
USPC .............................. 330/258, 260, 261, 69, 257
See application file for complete search history.

(56) References Cited

U.S. PATENT DOCUMENTS

| | | | | |
|---|---|---|---|---|
| 3,761,831 | A | * | 9/1973 | Foerster ........................... 330/69 |
| 5,166,635 | A | * | 11/1992 | Shih ....................... H03F 3/3061 330/253 |
| 6,222,416 | B1 | * | 4/2001 | Edeler ....................... H03F 3/26 330/255 |
| 6,268,770 | B1 | * | 7/2001 | Barbetta ................. H03F 1/086 330/264 |
| 6,380,807 | B1 | | 4/2002 | Brokaw |
| 6,617,838 | B1 | | 9/2003 | Miranda et al. |
| 6,956,727 | B1 | | 10/2005 | Brokaw |
| 7,193,464 | B2 | | 3/2007 | Wang et al. |
| 7,570,114 | B2 | * | 8/2009 | Tansley et al. ................. 330/258 |
| 8,446,205 | B2 | * | 5/2013 | Sakamoto et al. ............ 327/356 |
| 8,552,801 | B2 | * | 10/2013 | Myles ............................. 330/258 |
| 8,638,165 | B2 | * | 1/2014 | Shah et al. ......................... 330/9 |

OTHER PUBLICATIONS

Pallás-Areny, Ramón, "Common Mode Rejection Ratio in Differential Amplifiers," *IEEE Transactions on Instrumentation and Measurement*, vol. 40, No. 4, Aug. 1991.

* cited by examiner

*Primary Examiner* — Henry Choe
(74) *Attorney, Agent, or Firm* — Knobbe, Martens, Olson & Bear LLP

(57) ABSTRACT

In certain applications, differential amplifiers with infinite common mode rejection ratios are desirable. However, resistance mismatches due to imperfections in the manufacturing create finite common mode rejection ratio in differential amplifiers degrading their performance. Disclosed are apparatus and method for improving the common mode rejection ratio of practical differential amplifiers.

19 Claims, 7 Drawing Sheets

APPARATUS AND METHODS FOR IMPROVING COMMON MODE REJECTION RATIO

BACKGROUND OF THE INVENTION

1. Field of the Invention

This invention relates generally to electronics, and more particularly, to improving the common mode rejection ratio of differential amplifiers.

2. Description of the Related Art

A differential amplifier 106 shown in FIG. 1 ideally amplifies only the difference between the voltages Vip and Vin; however, a practical differential amplifier also amplifies the common mode input voltage. The common mode rejection ratio (CMRR) of a differential amplifier is a performance metric defined as the ratio of the differential gain of the differential amplifier over its common mode gain. What is needed is a differential amplifier with an improved CMRR.

SUMMARY OF THE DISCLOSURE

One embodiment includes an apparatus, wherein the apparatus includes a first circuit configured to generate a bias based at least partly on a common mode voltage of a differential signal provided as an input to a differential amplifier; and a second circuit configured to scale the bias to generate a scaled bias and to selectively provide the scaled bias to a first node or a second node of a first feedback path or a second feedback path of the differential amplifier to improve a common-mode rejection ratio of the differential amplifier.

One embodiment includes an electronically-implemented method of improving a common mode rejection ratio of a differential amplifier, wherein the method includes generating a bias with a first circuit based at least partly on a common mode voltage of a differential signal provided as an input to the differential amplifier; scaling the bias with a second circuit to generate a scaled bias; selectively providing the scaled bias to a first node or a second node of a first feedback path or a second feedback path of the differential amplifier to improve the common-mode rejection ratio of the differential amplifier.

BRIEF DESCRIPTION OF THE DRAWINGS

These drawings and the associated description herein are provided to illustrate specific embodiments of the invention and are not intended to be limiting.

DETAILED DESCRIPTION OF THE PREFERRED EMBODIMENT

Figure 1:
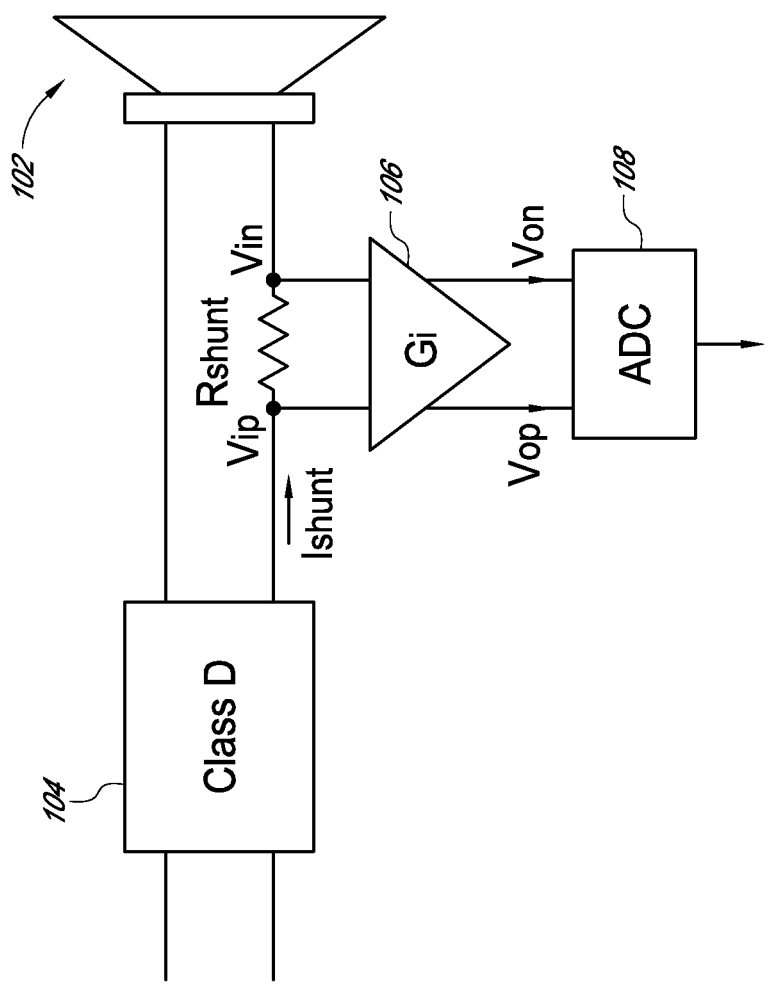
FIG. 1 illustrates an example of an application where an embodiment of the invention may advantageously be used to sense a current of interest.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Having a relatively high common mode rejection ratio can be useful in many situations. For example, it can be desirable to sense current flow to a load. For example, FIG. 1 shows an arrangement of components that may be found in an electronic device. A class D amplifier 104 used to drive a transducer or speaker 102. However, due to the floating nature of the outputs of the class D amplifier 104 and the switched output, observation of the output current can be relatively difficult. For example, if the transducer/speaker 102 fails, the failure should be sensed to protect the class D amplifier 104 from damage.

Problems with the speaker 102 can be detected by sensing the current $I_{shunt}$ going through a resistor $R_{shunt}$ connected between the nodes Vin and Vip. An approach for measuring this current is to use a fully differential amplifier 106 having the outputs Vop and Von and the differential gain Gi. The current of interest $I_{shunt}$ is given by $(Vip-Vin)/R_{shunt}$. The quantity (Vip−Vin) or the voltage across the resistor $R_{shunt}$ is given by (Vop−Von)/Gi. Then, $I_{shunt}$ can be observed as (Vop−Von)/($R_{shunt}$ Gi). An analog to digital converter (ADC) 108 may be used to convert the outputs of the differential amplifier to a digital form for further processing.

Figure 2:
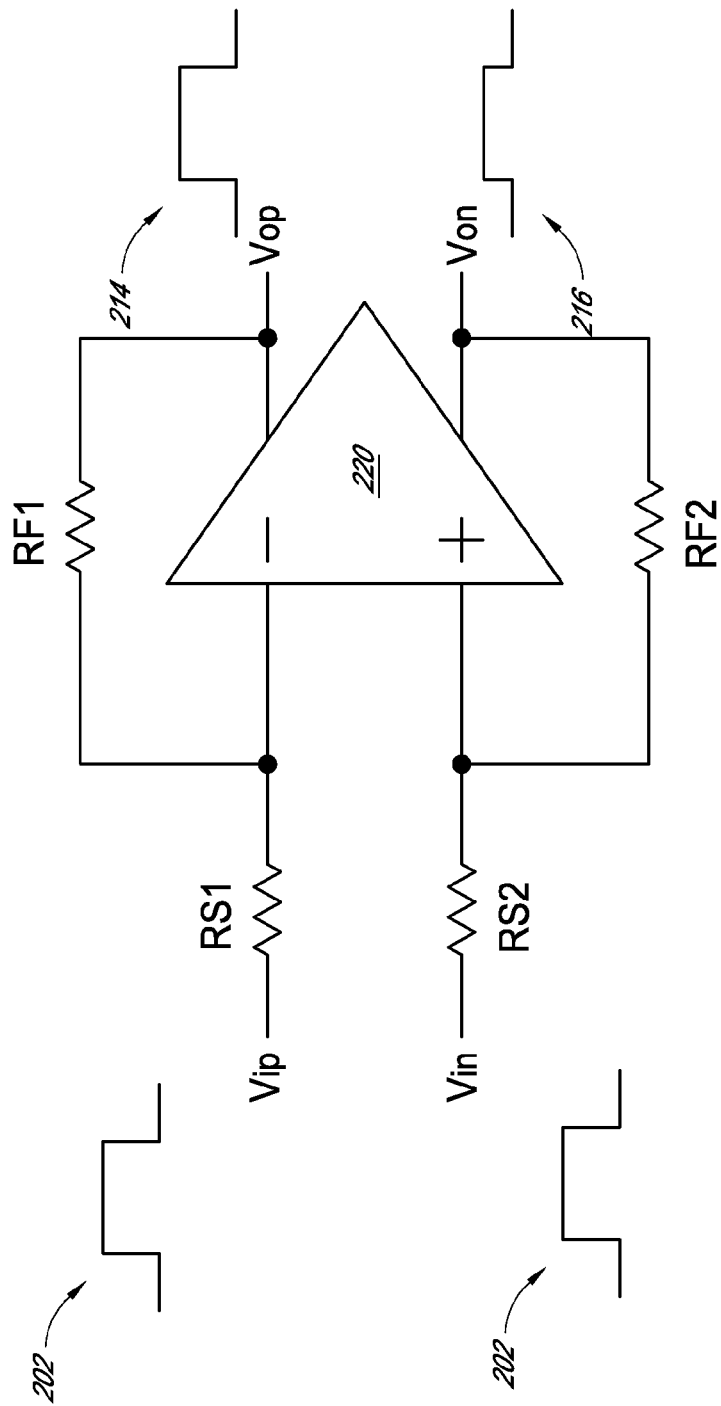
FIG. 2 illustrates the error in the output signal of a differential amplifier due to having a finite common mode rejection ratio (CMRR).

The common mode rejection ratio (CMRR) of an amplifier can be degraded by resistor mismatches present due to the imperfections in the manufacturing of the amplifier. A relatively poor CMRR can make the observations of the current Ishunt relatively unreliable. FIG. 2 demonstrates the effect of having a finite CMRR in the output of the amplifier 220. With the inputs Vip and Vin both identical, each carrying a signal 202, the amplifier 220 generates the differential outputs 214, 216 due to the finite CMRR. In the example shown in FIG. 2, an infinite CMRR may be approached if RS1=RS2 and RF1=RF2 and the amplifier 220 is ideal. However, imperfections in the manufacturing process results in usually RS1≠RS2 and RF1≠RF2 causing a differential signal in the outputs of the amplifier 220 even when the input signals are identical. The differential output due to this mismatch is given by:

$$Vod = \frac{2Vicm(\beta 2 - \beta 1) + Vocm(\beta 1 - \beta 2)}{\beta 1 + \beta 2}, \quad \text{(Eq. 1)}$$

where, $$\beta_{1,2} = \frac{RS_{1,2}}{RS_{1,2} + RF_{1,2}}, \quad \text{(Eq. 2)}$$

$$Vicm = \frac{Vip + Vin}{2}, \quad \text{(Eq. 3)}$$

and, $$Vocm = \frac{Vdd}{2} \quad \text{(Eq. 4)}$$

Where Vdd is the supply voltage connected to the amplifier.

Figure 3:
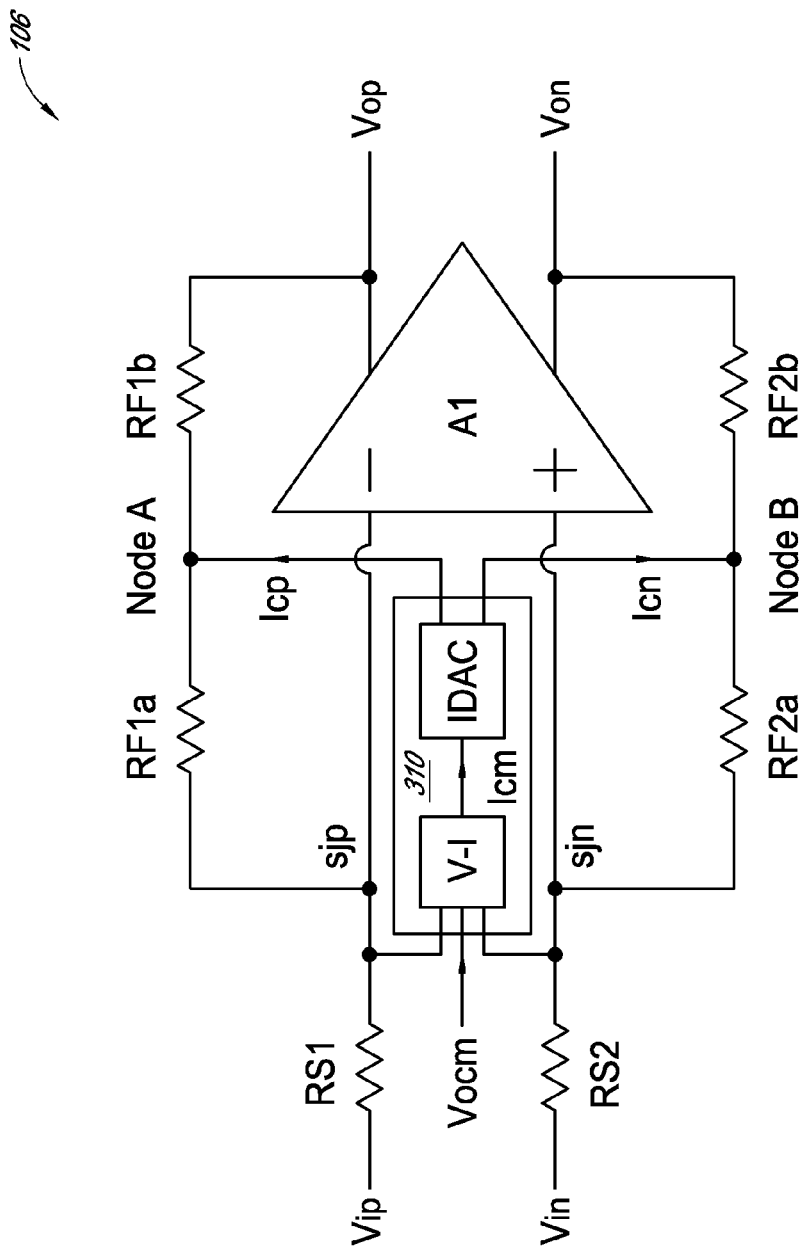
FIG. 3 illustrates an embodiment including a compensation circuit for reducing the common mode error of a differential amplifier.

FIG. 3 illustrates an embodiment of the differential amplifier 106. For a given mismatch present in a differential amplifier A1, there exists an amount of current, that if fed to the appropriate feedback network of the differential amplifier A1, will compensate for the common mode error, thereby correcting the output of the differential amplifier A1. If the difference between the outputs of the differential amplifier A1, that is, Vop-Von, is a positive amount for a positive common mode input, then injecting a current Icn into Node B of the non-inverting feedback network, decreases this positive amount. Similarly, if the difference between the outputs Vop-Von is a negative amount for a positive common mode input, then injecting a current Icp into Node A of the inverting feedback network decreases this negative amount. The circuit 310 as part of its own circuitry or logic circuitry (see, for example, block 510 of FIG. 5) can determine and generate the appropriate amount and direction of current used to offset the differential output due to the common mode input.

The feedback network of the differential amplifier 106 may include the resistors RF1a, RF1b, RF2a, RF2b as shown in FIG. 3. In some embodiments, the resistors RF1a, RF2a can be several orders of magnitude larger in resistance than the resistors RF1b, RF2b respectively. For example, the resistors RF1a, RF2a can be 10 to 15 times larger in resistance than the resistors RF1b and RF2b respectively. Choosing these resistor ratios can further improve the common mode rejection performance of the differential amplifier 106. As a non-limiting example, the resistors RF1a, RF1b, RF2a, and RF2b can be 600, 40, 600 and 40 kilo-ohms respectively. Other applicable amounts of resistance will be readily determined by one of ordinary skill in the art.

Figure 4:
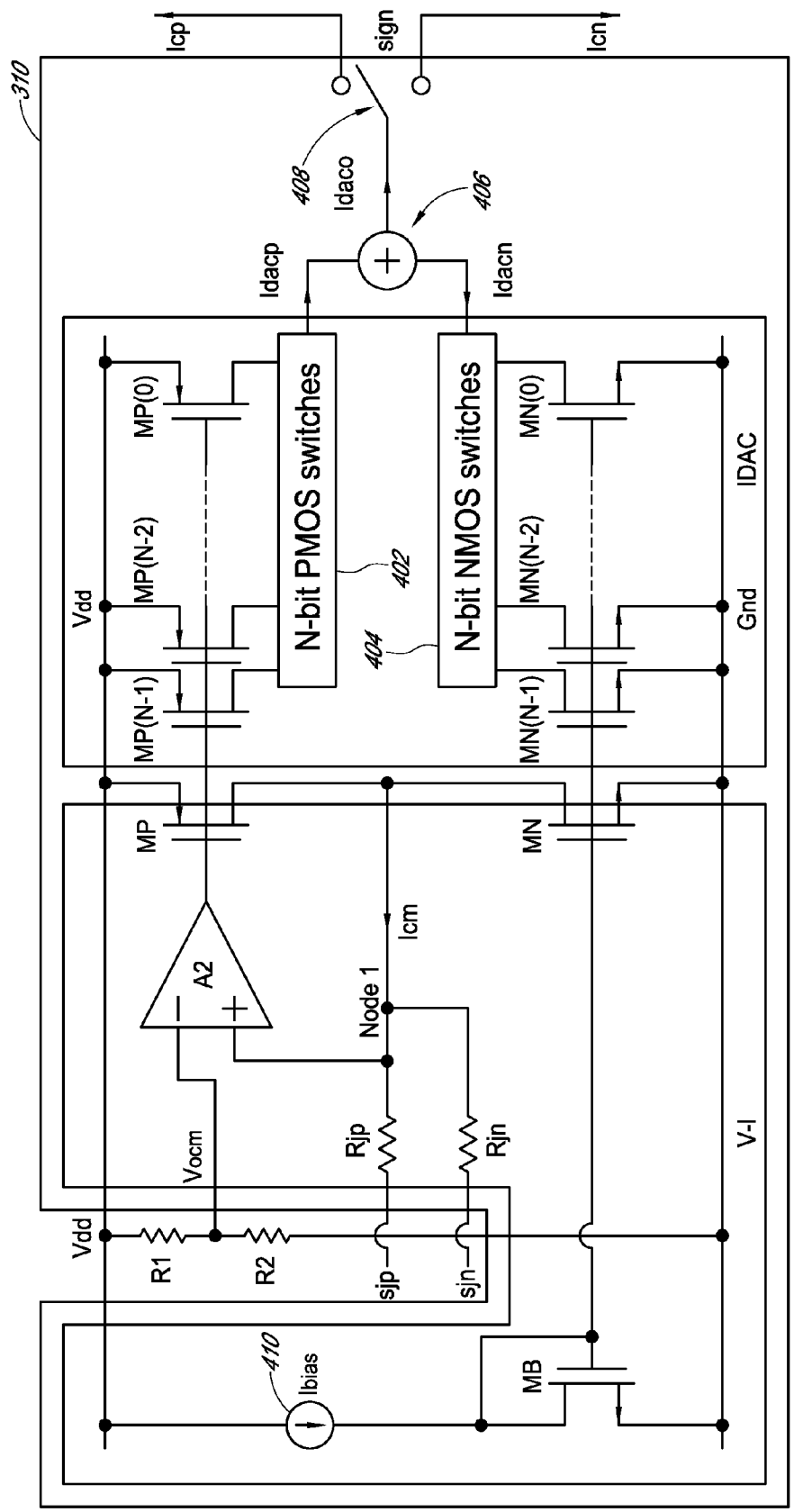
FIG. 4 illustrates an embodiment of a compensation circuit for reducing the common mode error of a differential amplifier.

FIG. 4 illustrates an embodiment of the circuit 310. The V-I converter may be implemented using an amplifier A2, a P-channel transistor MP, an N-channel transistor MN, resistors R1, R2, Rjp, Rjn, a current source 410, and an N-channel transistor MB to convert the common mode voltage present in the inputs of the amplifier 106 to a current Icm. The amplifier A2 can be an operational amplifier. At its inverting input, the amplifier A2 receives the common mode voltage Vocm, which can be obtained by a voltage divider using the resistors R1 and R2 between the high and low supply voltages, or in the case of ground referenced amplifiers, between the supply voltage and ground. At its non-inverting input, the amplifier A2 receives the common mode voltage of the inputs of the differential amplifier 106 through the voltage nodes sjp and sjn, via the resistors Rjp and Rjn. The amplifier A2 drives the gate of the transistor MP. The amplifier A2 and transistor MP are in negative feedback loop as a result of which the current Icm is generated based on the common mode input voltage of the differential amplifier 106. The transistor MP may be biased with a current source 410 and the transistors MN and MB.

In one embodiment, to set up biasing for the transistor MP, a current mirror arrangement of the transistors MB, MN along with a current source 410 can be used. The diode-connected transistor MB conducts the current Ibias from the current source 410. If the transistor MN is the same size as the transistor MB, the current through the transistor MN should also be Ibias. The current Ibias, the sizes of the transistors MB, MN and MP can be chosen for all transistors to operate in the saturation region. An exemplary amount of the current Ibias can be 20 micro-amps. Other applicable current amounts will be readily determined by one of ordinary skill in the art. The particular value of the current Ibias can vary based on the expected values of common mode voltage Vocm. The minimum value of the current Ibias depends on the maximum value of the current Icm. When the nodes sjp and sjn are higher in voltage than the common mode voltage Vocm, the direction of the current Icm is from Node 1 to the drain of the transistor MN. The current through the transistor MP is then given by Ibias-Icm. To maintain the transistor MP in saturation the minimum value of the current Ibias is approximately given by the following equation, $$Ibias(\min) \approx \frac{sjp(\max) - Vocm}{Rjp} + \frac{sjn(\max) - Vocm}{Rjn} \quad \text{(Eq. 5)}$$

where sjp(max) and sjn(max) are the maximum voltages observed at the inputs of the amplifier A1 at nodes sjp and sjn. The current Ibias is also chosen to allow for a stable negative feedback loop including the amplifier A2 and the transistor MP. Other methods of biasing can also be used.

If the open loop gain of the amplifier A2 is a high value, the voltage at the non-inverting input of the amplifier A2 converges to a value near the voltage value at the inverting input of the amplifier A2. The voltage at Node 1 should be approximately equal to the common mode voltage Vocm. Therefore, in the arrangement shown in FIG. 4, the current Icm is given by:

$$Icm = \frac{sjp - Vocm}{Rjp} + \frac{sjn - Vocm}{Rjn} \quad \text{(Eq. 6)}$$

The current Icm varies with the common mode voltage present at the inputs of the differential amplifier 106. The current through the transistor MP is Ibias+Icm and the current through the transistor MN is Ibias. A network of binary-weighted transistors MP(0) through MP(N−1) may be arranged to mirror and scale the current through the transistor MP generating a current Idacp. The transistors MP(0)-MP(N−1) progressively increase in size, from the least significant bit (LSB) transistor MP(0) being the smallest transistor to the most significant bit (MSB) transistor MP(N−1) being the largest transistor of the group such that each transistor from MP(0) to MP(N−1) conducts twice the amount of current than the smaller transistor before it. However, other weightings can alternatively be used. The drain of each transistor MP(0)-MP(N−1) may be connected to a switch of an N-bit pmos switch 402. If a particular switch is on, the transistor coupled to that switch is coupled to the output, and that transistor mirrors and scales the current through the transistor MP contributing to the current Idacp. Similarly, a network of binary weighted transistors MN(0) through MN(N−1) connected to an N-bit NMOS switch 404 may be arranged to mirror and scale the current through the transistor MN generating a current Idacn. The transistors MN(0)-MN(N−1) also progressively increase in size, from the least significant bit (LSB) transistor MN(0) being the smallest transistor to the most significant bit (MSB) transistor MN(N−1) being the largest transistor of the group such that each transistor from MN(0) to MN(N−1) conducts twice the amount of current than the smaller transistor before it. However, other weightings can alternatively be used.

While illustrated with the amplifier A2 driving pmos transistors and a current source 410 biasing nmos transistors, in an alternative embodiment, the amplifier A2 can drive nmos transistors and the current source 410 can be reconfigured to bias pmos transistor. Also, The nmos or pmos transistors described herein can correspond to transistors known as metal-oxide-semiconductor field-effect transistors (MOSFETs). While the terms "metal" and "oxide" are present in the name of the device, it will be understood that these transistors can have gates made out of materials other than metals, such as polycrystalline silicon, and can have dielectric "oxide" regions made from dielectrics other than silicon oxide, such as from silicon nitride or high-k dielectrics. In further alternative embodiments, bipolar transistors can be used instead of nmos or pmos transistors.

The circuit 310 can use a binary code Q corresponding to the switches in the N-bit pmos and nmos switches. The code Q having N binary digits may determine which switches in the N-bit pmos and nmos switches 402 and 404 are on and which are off. The currents Idacp and Idacn are then given by:

$$I_{dacp} = \frac{Q}{2^N - 1}(Ibias + Icm) \quad \text{(Eq. 7)}$$

$$I_{dacn} = \frac{Q}{2^N - 1} Ibias \quad \text{(Eq. 8)}$$

Idacp-Idacn gives the current Idaco:

$$I_{daco} = \frac{Q}{2^N - 1} Icm \quad \text{(Eq. 9)}$$

The circuit 310 as part of its own configuration or using additional circuitry can determine whether the scaled current may be fed into the inverting or non-inverting feedback circuitry of the amplifier A1 to best compensate for the common mode error at the output of the amplifier A1. In FIG. 4, the current Idaco may be fed to the inverting feedback circuitry of the amplifier A1 via a sign switch 408, directing the current Idaco to Node A via the current Icp, when the sign switch 408 state is on. On the other hand, the current Idaco may be fed to the non-inverting feedback circuitry of the amplifier A1 via the sign switch 408, directing the current Idaco to Node B via the current Icn, when the sign switch 408 state is off.

Figure 5:
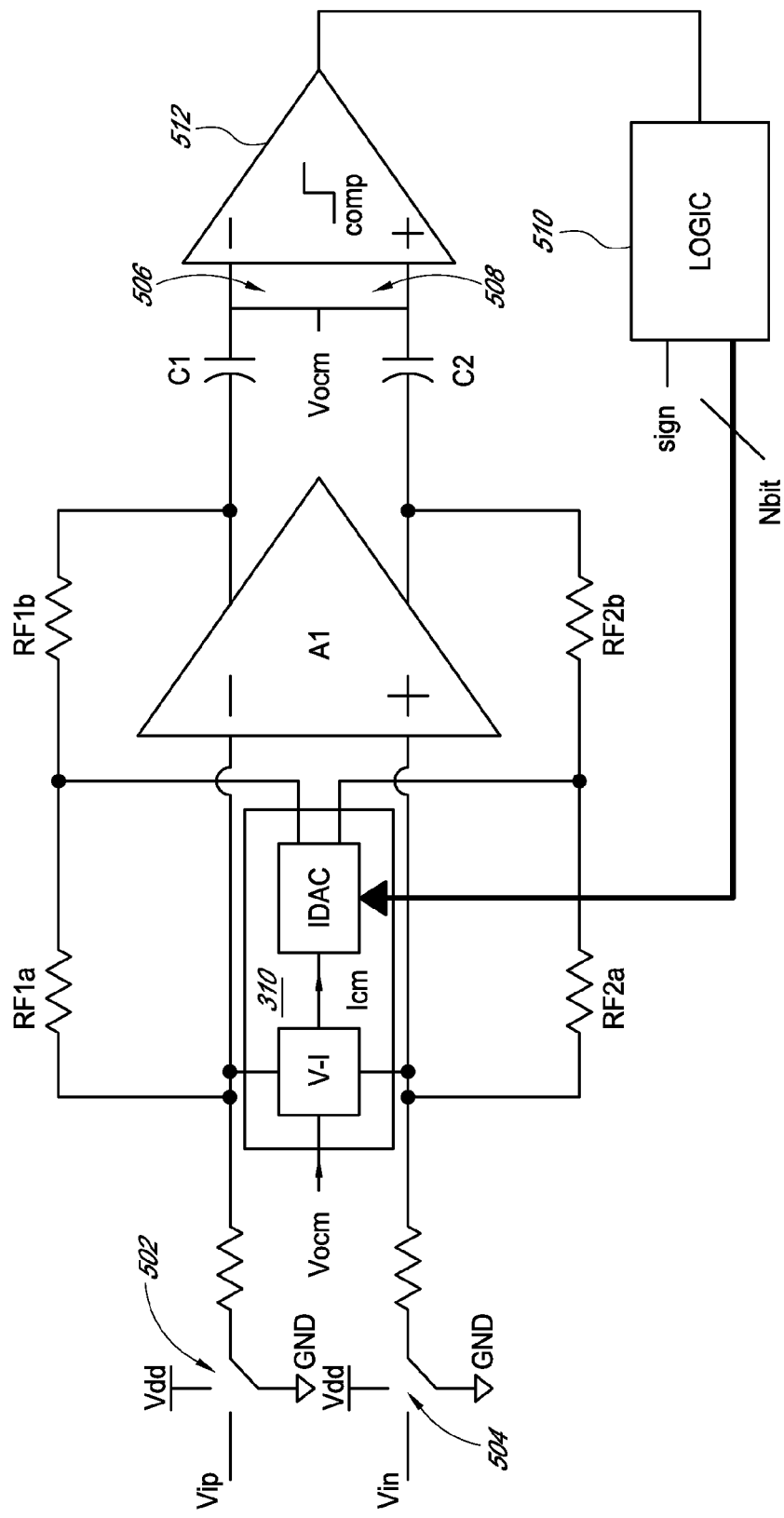
FIG. 5 illustrates a first phase of the configuration of an embodiment used to calibrate the compensation circuit in FIG. 3 in a first and second phase.
Figure 6:
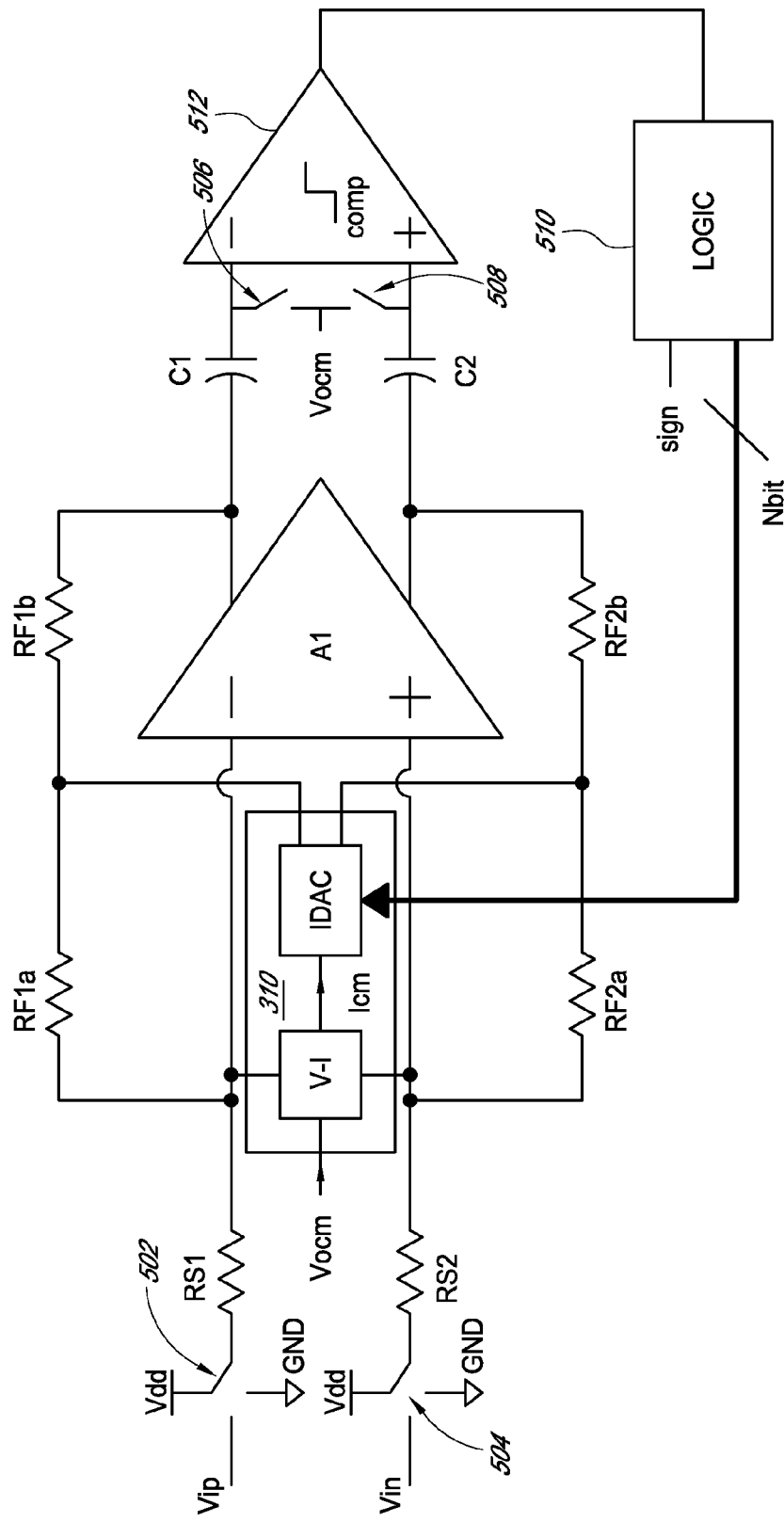
FIG. 6 illustrates a second phase of the configuration of an embodiment used to calibrate the compensation circuit in FIG. 3 in a first and second phase.

A configuration and method for calibrating the amplifier 106 by determining the sign switch 408 state and appropriate code Q is described with reference to FIGS. 5, 6 and 7.

The outputs of the differential amplifier A1 are coupled to the capacitors C1, C2 and provided as inputs to a comparator 512. The output of the comparator 512 is provided as an input to a control logic circuit 510, which determines the N-bit binary code Q and the sign switch 408 state. As a non-limiting example, the control logic circuit 510 may be implemented using successive approximation. However, other methods, such as brute force, can alternatively be used. In the illustrated example, two calibration phases are used. However, in alternative embodiments, more than two phases can be used. The difference between the phases provides a stimulus to observe the common-mode error, which can then be reduced via control of the state of the sign switch 408 and the amount of scaling. Phase 1 is a resetting phase, where the inputs of the differential amplifier 106 are grounded, the inputs of the comparator 512 are tied together via switches 506 and 508 and to the common mode voltage Vocm, causing the capacitors C1 and C2 to store the offset of the amplifier A1 and comparator 512 relative to the common mode voltage Vocm. In phase 2, the inputs of the differential amplifier 106 are tied to the high supply voltage, for example, Vdd, and the comparator 512 compares the differential outputs of the amplifier A1. The switches 506 and 508 are opened allowing the capacitors C1 and C2 to store the voltages at the outputs of the differential amplifier A1. As described below, the control logic circuit 510 uses the output of the comparator 512 at the end of phase 2 to determine the value of a binary bit under investigation. To determine the scaling factor to be used, phases 1 and 2 are repeated N times for every bit in the N-bit binary code Q. After the sign switch 408 state and binary code Q are determined the pmos, nmos and sign switches 402, 404 and 408 are latched on using those determined values for the duration of the operation of the amplifier 106.

Figure 7:
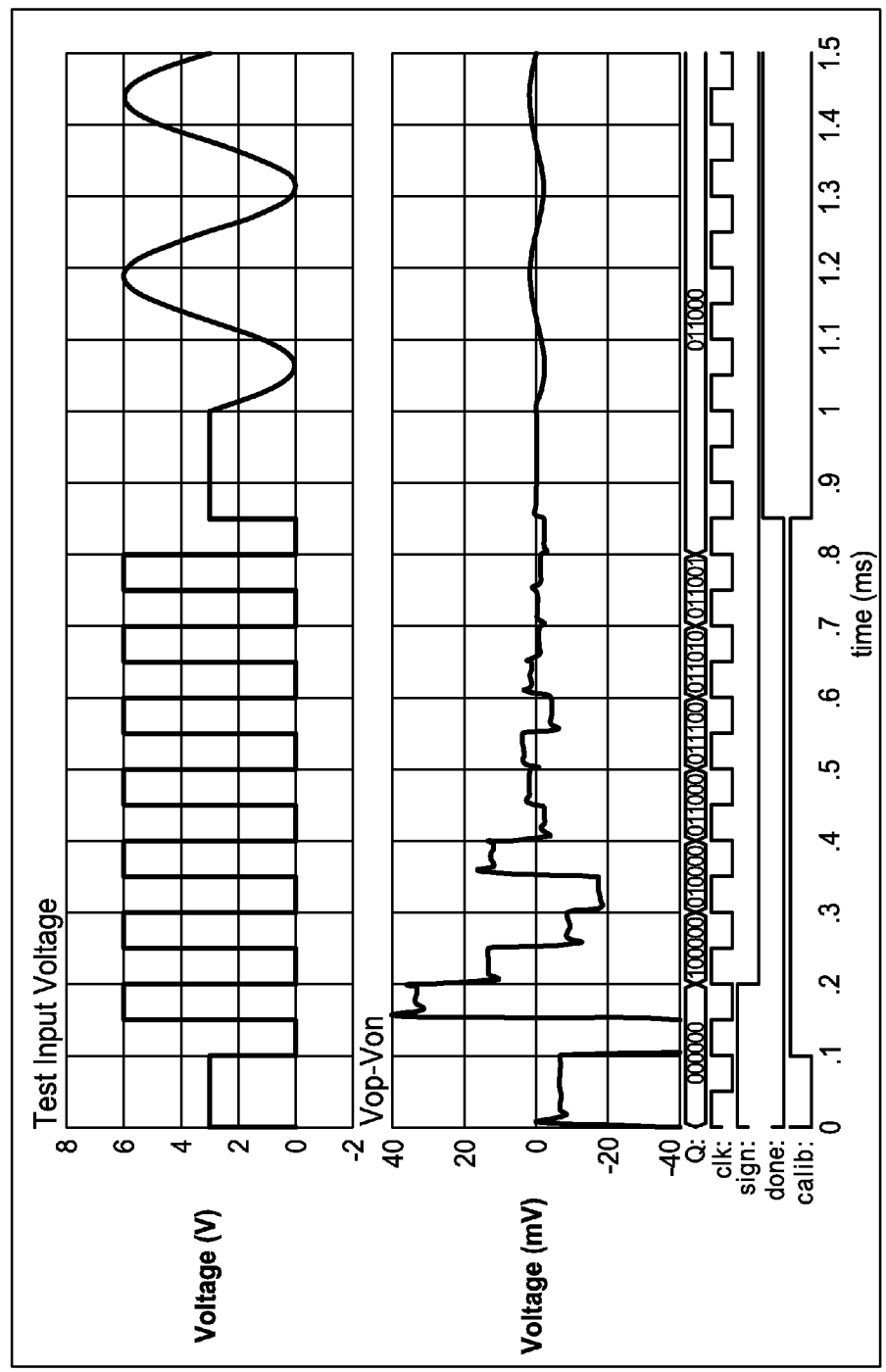
FIG. 7 is a waveform plot illustrating one example of calibration for a compensation circuit.

The operation of the circuit 310, comparator 512 and control logic circuit 510 are further explained in an example, using the graphs in FIG. 7 for a 6-bit binary code Q. The top graph in FIG. 7 is a plot of a common mode test input voltage applied at the inputs, Vip and Vin of the differential amplifier G1 versus time in milliseconds (ms). The bottom graph in FIG. 7 is a plot of the differential voltage, Vop−Von, observed at the outputs of the differential amplifier 106 versus time in milliseconds (ms) as a result of the common mode test input voltage at the inputs, Vip and Vin, of the differential amplifier 106. The goal is to find the binary code Q and the sign switch 408 state such that the differential output, Vop−Von, observed due to a range of common mode test input voltages at the inputs, Vip and Vin, of the differential amplifier 106, is zero or nearly zero in response to the range of possible common mode input values.

When high, the signal "calib" indicates that the calibration process is being performed. When high, the signal "done" indicates completion of the calibration process. The signal sign denotes the sign switch 408 state, determining in which direction the scaled current may be injected. The signal clk denotes the clock signal. During the high clock cycles, phase 1 operations are performed, while phase 2 operations are performed during the low clock cycles. The signal Q denotes which binary code Q is being tested. The value of the signal Q controls which of the transistors of the binary-weighted switches 402, 404 are on and which are off. In the illustrated example, a "1" corresponds to on and a "0" corresponds to off. Various settings are tested and either used or rejected.

Starting from 0.1 ms, the calibration operations begin. From 0.15 ms to 0.2 ms, corresponding to phase 2 of the calibration operations, the binary code Q is 000000 and the sign switch 408 state is 1. The binary code Q of all zeroes means that all switches of the nmos and pmos switches 402 and 404 of FIG. 4 are off and no current are injected via the circuit 310. The differential output is near 35 millivolts (mV). This shows that the amplifier 106 under calibration has a common mode error of a positive value, therefore injecting more current into the non-inverting feedback network is needed to pull the differential output down. The sign switch 408 state is then set to 0 to direct the scaled current Icm via the current Icn to Node B. The sign switch 408 state remains the same and different scaled versions of the current Icm are tested using different values of the binary code Q to determine the current Icn needed to compensate for the common mode error observed in the clock cycle 0.15 ms-0.2 ms and to bring the differential output to a near zero value.

Between 0.25 ms to 0.3 ms, phase 2 operations are performed using the binary code Q=100000. The differential output is pulled to a negative value near −10 mV. This shows that the scaling corresponding to the binary code Q=1000000 injects an excessive amount of current into the non-inverting feedback network. The binary code Q=1000000 corresponds to the most significant bit (MSB) transistors MP(N−1), or in this example MP(5), and MN(N−1), or in this example MN(5), in the on position and conducting through their respective pmos and nmos switches in the N-bit pmos switches 402 and N-bit nmos switches 404. Since these two transistors pull the differential output too far down into the negative, the process determines not to turn on these transistors for operation and the switches in the pmos and nmos N-bit switches 402 and 404 corresponding to their drains are set to off. The most significant bit in the binary code Q is then reverted back to zero.

Between 0.35 ms to 0.4 ms, phase 2 calibration operations are performed for the binary code Q=010000. For the binary code Q=010000, the switches in the pmos and nmos N-bit switches corresponding to MP(4) and MN(4) are on. The differential output is pulled down to nearly 15 mV, which is a better common mode rejection performance compared to the initial value of nearly 35 mV. Setting the second bit to 1 is an appropriate value. The value of the second most significant bit is kept at 1.

Between 0.45 ms to 0.5 ms, phase 2 calibration operations are performed using the binary code Q=011000. For this code the differential output is pulled down to near 1 mV which is yet a better common mode rejection performance. Setting the third most significant bit to 1 is an appropriate value. The value of the third most significant bit is kept at 1.

Between 0.55 ms to 0.6 ms, phase 2 calibration operations are performed for the binary code Q=011100. For this code the differential output is pulled down to a negative value. Since the sign switch 408 state is already set at 0 directing the scaled current through the non-inverting feedback network, the codes that lead to a negative differential output voltage are not used since no compensating current can be directed to the inverting feedback network. Setting the fourth most significant bit to 1 was therefore incorrect. This control bit is then kept at 0.

Between 0.65 ms to 0.7 ms, phase 2 calibration operations are performed for the binary code Q=011010. For this code the differential output is pulled down into a negative value; therefore, this control bit is kept at 0.

Between 0.75 ms to 0.8 ms, phase 2 calibration operations are performed for the binary code Q=011001. For this code the differential output is pulled down into a negative value; therefore, this control bit is kept at 0.

Between 0.85 ms to 0.9 ms, since the last bit tested was the lowest significant bit (LSB), the calibration operations are done and the binary code Q is determined to be 011000 for the amplifier under calibration in this example. For extreme test common mode input voltages tested after 1 ms, using the binary code Q=011000, the differential output remains very near zero, thereby significantly improving the CMRR performance of amplifier 106.

What is claimed is:

1. An apparatus comprising:
a biasing circuit configured to generate a bias based at least partly on a common mode voltage of a differential signal provided as an input to a differential amplifier; and
a scaling circuit configured to scale the bias to generate a scaled bias and to selectively provide the scaled bias to a first node or a second node of a first feedback path or a second feedback path of the differential amplifier to improve a common-mode rejection ratio of the differential amplifier
wherein the first feedback path is electrically coupled to a first input of the differential amplifier and the second feedback path is electrically coupled to a second input of the differential amplifier,
wherein the common mode rejection ratio comprises a ratio of a differential gain of the differential amplifier to a common mode gain of the differential amplifier.

2. The apparatus of claim 1, wherein the first feedback path of the differential amplifier comprises a first resistor and a second resistor arranged in series operatively coupled between a first output of the differential amplifier and a first input of the differential amplifier, and the second feedback path of the differential amplifier comprises a third resistor and a fourth resistor arranged in series operatively coupled between a second output of the differential amplifier and a second input of the differential amplifier.

3. The apparatus of claim 2, wherein the scaling circuit is configured to provide the bias to the node between the first resistor and the second resistor or the node between the third resistor and the fourth resistor.

4. The apparatus of claim 1, wherein the biasing circuit is configured to generate the bias using a negative feedback loop.

5. The apparatus of claim 1, further comprising:
a control logic circuit wherein the control logic circuit is configured to cause the scaling circuit to scale the bias using successive approximation.

6. The apparatus of claim 1, wherein the scaling circuit is configured to scale the bias using binary weighted transistors.

7. The apparatus of claim 2, wherein the first resistor is larger in resistance than the second resistor and the third resistor is larger in resistance than the fourth resistor.

8. The apparatus of claim 1, further comprising:
a control logic circuit configured to determine whether a differential mode output voltage of the differential amplifier is positive or negative;
wherein the control logic circuit is configured to cause the scaling circuit to provide the bias to the first feedback path of the differential amplifier when the differential mode output voltage of the differential amplifier is negative, wherein the first feedback path of the differential amplifier is between a first output of the differential amplifier and an inverting input of the differential amplifier;
wherein the control logic circuit is further configured to cause the scaling circuit to provide the bias to the second feedback path of the differential amplifier when the differential mode output voltage of the differential amplifier is positive, wherein the second feedback path of the differential amplifier is between a second output of the differential amplifier and a non-inverting input of the differential amplifier.

9. The apparatus of claim 8, wherein:
the scaling circuit is configured to mirror and scale the bias through N pairs of binary weighted transistors,
the control logic circuit is further configured to perform a first operation when a sign value is a first state, wherein the first operation, the Nth pair in the scaling circuit is mirroring and scaling the bias when the differential mode output voltage of the differential amplifier is a negative value, and the Nth pair in the scaling circuit is not mirroring and scaling the bias when the differential mode output voltage is a positive value,
the control logic circuit is further configured to repeat the first operation for every pair of the N pairs of binary weighted transistors in the scaling circuit;
the control logic is further configured to perform a second operation when the sign value is a second state, wherein the second operation, the Nth pair in the scaling circuit is mirroring and scaling the bias when the differential mode output voltage of the differential amplifier is a positive value, and the Nth pair in the scaling circuit is not mirroring and scaling the bias when the differential mode output voltage of the differential amplifier is a negative value, the control logic circuit is further configured to repeat the second operation for every pair of the N pairs of binary weighted transistors in the scaling circuit;

wherein the scaling circuit provides the scaled bias to the first feedback path when the sign value is the first state and the control logic circuit provides the scaled bias to the second feedback path when the sign value is the second state.

10. An electronically-implemented method of improving a common mode rejection ratio of a differential amplifier comprising:

generating a bias with a biasing circuit based at least partly on a common mode voltage of a differential signal provided as an input to the differential amplifier;

scaling the bias with a scaling circuit to generate a scaled bias;

selectively providing the scaled bias to a first node or a second node of a first feedback path or a second feedback path of the differential amplifier to improve the common-mode rejection ratio of the differential amplifier wherein the first feedback path is electrically coupled to a first input of the differential amplifier and the second feedback path is electrically coupled to a second input of the differential amplifier, wherein the common mode rejection ratio comprises a ratio of a differential gain of the differential amplifier to a common mode gain of the differential amplifier.

11. The method of claim 10, wherein the first feedback path of the differential amplifier comprises a first resistor and a second resistor arranged in series between a first output of the differential amplifier and a first input of the differential amplifier, and the second feedback path of the differential amplifier comprises a third resistor and a fourth resistor arranged in series between a second output of the differential amplifier and a second input of the differential amplifier.

12. The method of claim 11, further comprising providing the bias to the node between the first resistor and the second resistor or the node between the third resistor and the fourth resistor.

13. The method of claim 10, further comprising generating the bias using a negative feedback loop.

14. The method of claim 10, further comprising causing with a control logic circuit the scaling circuit to scale the bias using successive approximation.

15. The method of claim 10, wherein the scaling circuit is configured to scale the bias using a plurality of binary-weighted transistors.

16. The method of claim 11, wherein the first resistor is larger in resistance than the second resistor, and the third resistor is larger in resistance than the fourth resistor.

17. The method of claim 10, further comprising:
determining with a control logic circuit whether a differential mode output voltage of the differential amplifier is positive or negative;
causing the scaling circuit to provide the bias to the first feedback path of the differential amplifier when the differential mode output voltage of the differential amplifier is negative, wherein the first feedback path of the differential amplifier is between a first output of the differential amplifier and an inverting input of the differential amplifier;
causing the scaling circuit to provide the bias to the second feedback path of the differential amplifier when the differential mode output voltage of the differential amplifier is positive, wherein the second feedback path of the differential amplifier is between a second output of the differential amplifier and a non-inverting input of the differential amplifier.

18. The method of claim 17, further comprising:
mirroring and scaling with the scaling circuit the bias through N pairs of binary weighted transistors,
performing with the control logic circuit a first operation when a sign value is a first state, wherein the first operation, the Nth pair in the scaling circuit is mirroring and scaling the bias when the differential mode output voltage of the differential amplifier is a negative value, and the Nth pair in the scaling circuit is not mirroring and scaling the bias when the differential mode output voltage is a positive value,
repeating with the control logic circuit the first operation for every pair of the N pairs of binary weighted transistors in the scaling circuit;
performing with the control logic circuit a second operation when the sign value is a second state, wherein the second operation, the Nth pair the scaling circuit is mirroring and scaling the bias when the differential mode output voltage of the differential amplifier is a positive value, and the Nth pair in the scaling circuit is not mirroring and scaling the bias when the differential mode output voltage of the differential amplifier is a negative value,
repeating with the control logic circuit the second operation for every pair of the N pairs of binary weighted transistors in the scaling circuit;
wherein the scaling circuit provides the scaled bias to the first feedback path when the sign value is the first state and the control logic circuit provides the scaled bias to the second feedback path when the sign value is the second state.

19. An apparatus for improving a common mode rejection ratio of a differential amplifier, the apparatus comprising:
a means for generating a bias based at least partly on a common mode voltage of a differential signal provided as an input to the differential amplifier;
a means for scaling the bias to generate a scaled bias; and
a means for selectively providing the scaled bias to a first node or a second node of a first feedback path or a second feedback path of the differential amplifier to improve the common-mode rejection ratio of the differential amplifier
wherein the first feedback path is electrically coupled to a first input of the differential amplifier and the second feedback path is electrically coupled to a second input of the differential amplifier,
wherein the common mode rejection ratio comprises a ratio of a differential gain of the differential amplifier to a common mode gain of the differential amplifier.

\* \* \* \* \*